SWITCHED FREQUENCY AND PHASE COMPARATOR

Filed March 24, 1967 2 Sheets-Sheet 1

INVENTOR.
ALAN G. GRACE

BY
FOWLER, KNOBBE
& MARTENS
ATTORNEYS.

SWITCHED FREQUENCY AND PHASE COMPARATOR

Filed March 24, 1967 2 Sheets-Sheet 2

INVENTOR.
ALAN G. GRACE
BY
FOWLER, KNOBBE
& MARTENS
ATTORNEYS.

3,478,178

SWITCHED FREQUENCY AND PHASE COMPARATOR

Alan G. Grace, San Carlos, Calif., assignor, by mesne assignments, to Alan R. Fowler, Orange, Calif., trustee Filed Mar. 24, 1967, Ser. No. 625,788
Int. Cl. H02k *27/20*
U.S. Cl. 179—100.2 4 Claims

ABSTRACT OF THE DISCLOSURE

A digital frequency comparator generates square waves responsive to reference and feedback signals in a servo loop such that the square wave is always up when the feedback pulse frequency is too low, down when the feedback pulse frequency is too high and alternating with variable pulse widths when the feedback pulse frequency is synchronized with the reference pulse frequency. Synchronization is detected, and a control signal for the servo loop is provided through a switching means which selects the output of the digital frequency comparator when the feedback frequency is higher or lower than the reference frequency and the output of a sample and hold phase comparator when the reference and feedback pulses are in synchronization.

Figure 1:
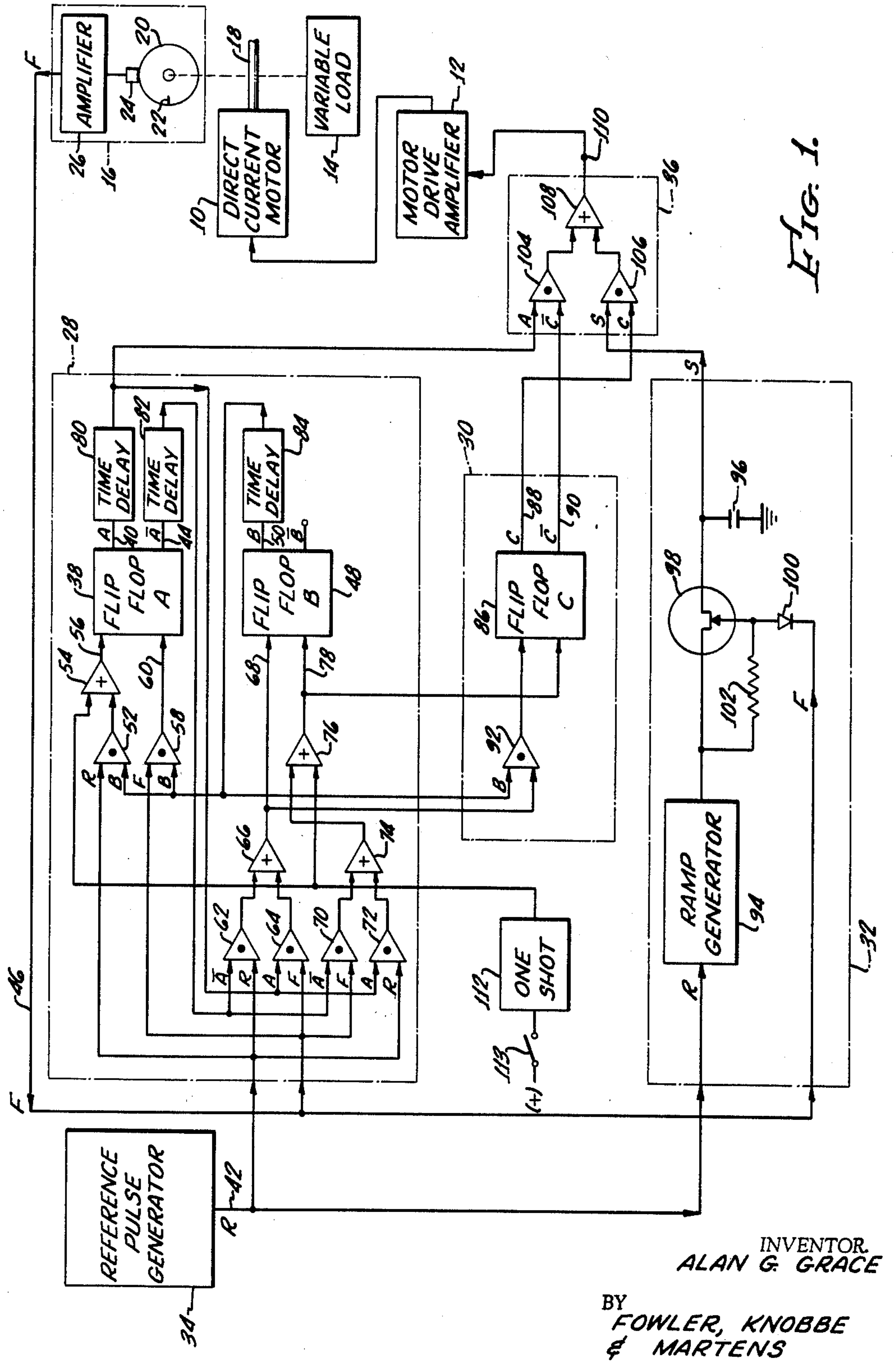

This invention relates to frequency and phase comparators as used in a servo loop for providing a control signal responsive to the frequency and phase difference between a reference signal and a feedback signal, and has particular reference to switched frequency and phase comparators for providing such a control signal.

Conventional frequency comparators that operate essentially on an analog basis require a finite frequency difference in the reference and feedback signals in order to maintain their operation, thereby resulting in an unacceptable cumulative error when applied to the control of some systems such as the tape transport system in a video tape recorder. This problem can be eliminated by comparing the reference and feedback frequencies on a digital basis; however, when the frequency difference is reduced to zero, the output of the digital frequency comparator, while containing phase difference information, has a very low signal to noise ratio. Efforts to improve this signal to noise ratio have meet with some success but have required undesirable design compromises in one or more of the factors of complexity, reliability of operation, and reduction in frequency response or fidelity of the resultant control signal itself.

In accordance with the present invention these difficulties are eliminated and additional advantages are obtained by means of a circuit which combines a phase comparator with a digital frequency comparator, a detecting means, and a switch means responsive to the detecting means for alternatively coupling the output of the phase comparator and the digital frequency comparator to a control signal output terminal.

The phase comparator is responsive to the reference and feedback signals for providing an output signal which varies with phase difference. The digital frequency comparator is responsive to the reference and feedback signals for generating an output signal at a first level responsive to synchronous reference and feedback signals going out of synchronization in one direction and an output signal at a second level responsive to a synchronous reference and feedback signals going out of synchronization in the opposite direction. The detecting means detects synchronization of the reference and feedback signals.

In the preferred embodiment of the invention, the detecting means is digital and is responsive to synchronized reference and feedback signals going out of synchronization in either direction for detecting the first cycle of the reference and feedback signals going out of synchronization in the opposite direction, and generates a digital output signal measuring this interval coincident with the reference and feedback signals producing it. The reference and feedback signals are pulse trains, and the phase comparator is a sample and hold circuit driven by the reference and feedback pulses.

Figure 2:
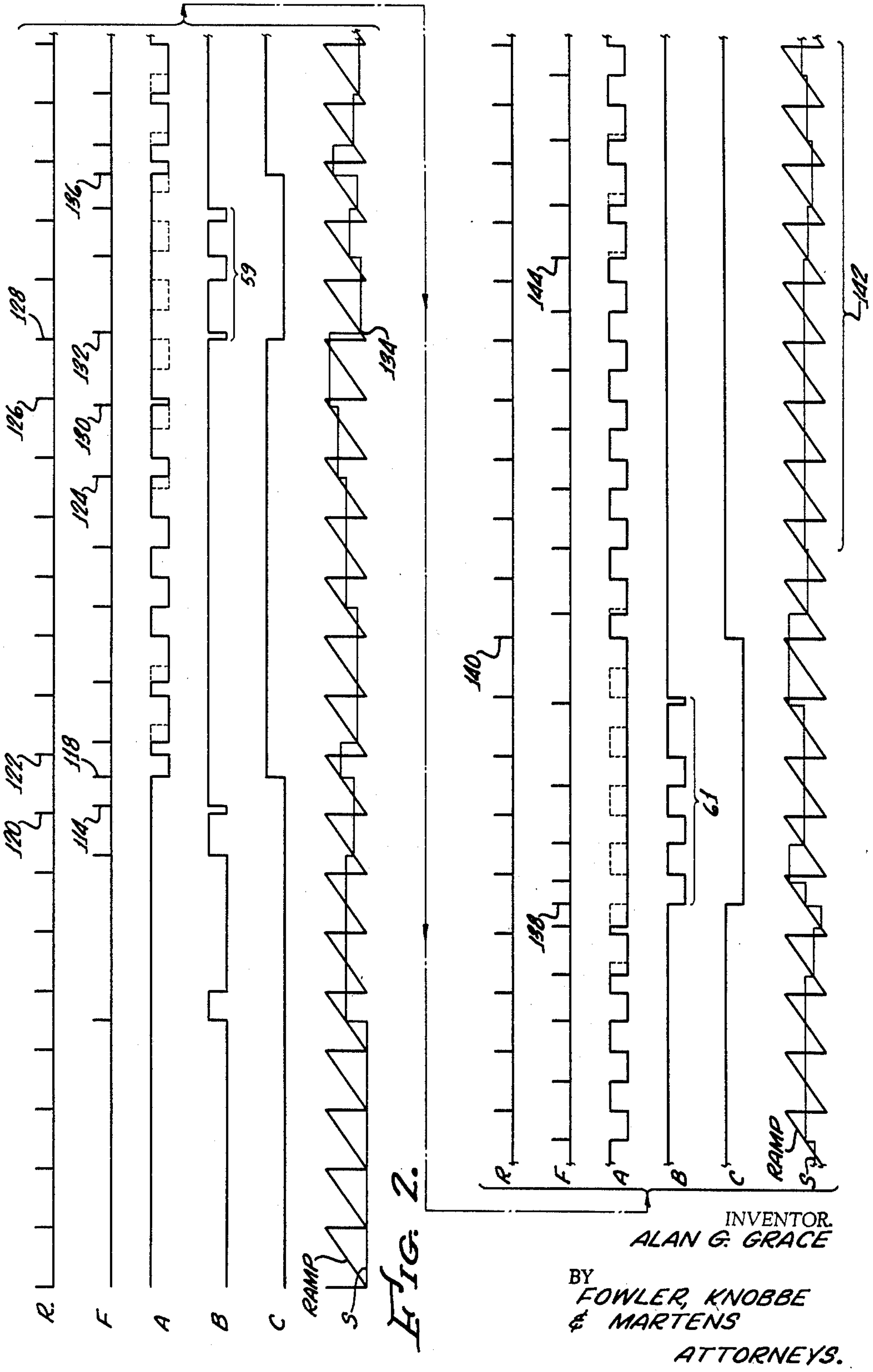

The present invention and its advantages will be more clearly understood by reference of the following description of a preferred embodiment thereof taken in conjuction with the accompanying drawings in which:

FIG. 1 is a schematic circuit diagram of the preferred embodiment of the present invention connected in a servo loop; and, FIG. 2 is a waveform diagram illustrating the operation of the circuit of FIG. 1 qualitatively.

Referring now to FIG. 1, a direct current motor 10 controlled by a motor drive amplifier 12 drives a variable load 14 and a feedback pulse generator 16. The feedback pulse generator produces feedback pulses F, hereinafter called F pulses, in accordance with the rotary position of the motor shaft 18.

As illustrated, the feedback pulse generator 16 may constitute a disc 20 having one or more magnetic marks 22 spaced around its periphery and rotated by the motor shaft 18 in proximity to a magnetic reproduce head 24 connected to an amplifier 26 for producing an F pulse each time a magnetic mark 22 passes the head 24.

A digital frequency comparator 28, a digital detector 30, a sample and hold phase comparator 32, a reference pulse generator 34, and an electronic switch 36 all are connected with the feedback pulse generator 16 in a servo loop running from the direct current motor back to the motor drive amplifier 12. The function of the servo loop is to provide a control signal to the motor drive amplifier which causes the direct current motor to syncronize its speed ant more particularly its rotary shaft position with the reference pulses R from the reference pulse generator 34.

Th digital frequency comparator 28 includes a first flip flop 38, hereafter called the A flip flop, which acts as a square wave generator to provide an output signal A on its set output terminal 40. The output signal A goes to a digital "1" when the flip flop is set by an R pulse over a lead 42 from the reference pulse generator, and goes to a digital "0" level when the flip flop is reset by an F pulse over a lead 46 from the feedback pulse generator 16. The digital "1" and "0" levels are used in their conventional sense to refer to the "on" and "off" voltage levels for the signal for logic control. The reverse of the square wave, or the $\bar{A}$ signal is provided at the reset output terminal 44 of the A flip flop. Thus when the A flip flop is reset, $\bar{A}$ is "1"; and, when it is set, $\bar{A}$ is "0."

The digital frequency comparator includes a second flip flop 48, hereafter called the B flip flop, which, analogous to the A flip flop, provides an output signal level B on its set output terminal 50 and $\bar{B}$ on its reset output terminal.

The output signal B of the B flip flop is utilized to inhibit the F pulses from resetting the A flip flop when the F pulses are at a lower frequency than the R pulses and is utilized to inhibit the R pulses from setting the A flip flop when the F pulses are at a higher frequency than the R pulses. This is accomplished by applying the R pulses and the B signal to an "and" gate 52, the output of the "and" gate in turn being coupled through an "or" gate 54 to the set terminal 56 of the A flip flop; and, by applying the F pulses and the B signal through another "and" gate 58 to the reset input terminal 60 of the A flip flop. Thus, when the B flip flop is reset, B is "0," and the R and F pulses cannot get through the "and" gates 52, 58 to set or reset the A flip flop. When the B flip flop is set, the B signal goes to "1" whereby both the R and F pulses can get through the "and" gates 52, 58 to set and reset the A flip flop coincident with these pulses to produce a square wave A which has a pulse width that varies with the phase difference between these pulse trains. By inspection, as seen for example in FIG. 2 during the interval inidcated by the bracket 59, the B flip flop will cycle to prevent F pulses from resetting the A flip flop once the F pulse frequency goes out of synchronization by becoming lower than the R pulse frequency and will continue to block the F pulses until the first cycle when the F pulse frequency becomes greater than the R pulse frequency. Similarly, as seen in the bracketed interval 61 in FIG. 2, the R pulses are blocked by cycling of the B flip flop when the synchronized R and F pulses go out of synchronization by the F pulses assuming a higher frequency and until the first cycle of F pulses assuming a lower frequency.

The B flip flop is set and reset by the R and F pulses in conjunction with the A and $\overline{A}$ signals from the A flip flop. Thus, in a first tree of gates, the $\overline{A}$ signal and the R pulses are applied to a first "and" gate 62 and the A signal and F pulses are applied to a second "and" gate 64, the output of these "and" gates being applied through an "or" gate 66 to the set input terminal 68 of the B flip flop. In reverse order in a second tree of gates, the $\overline{A}$ signal and F pulses are applied to a first "and" gate 70 and the A signal and R pulses are applied to a second "and" gate 72, the output of both "and" gates being applied through an "or" gate 74, and through an additional "or" gate 76 to the reset input terminal 78 of the B flip flop.

The output signals A and $\overline{A}$ of the A flip flop both are applied through time delays 80, 82 respectively, and the B signal from the B flip flop is applied through a time delay 84, all prior to using the A, $\overline{A}$ and B signals at the various gate inputs in order that the preceding condition of the A and B flip flops will determine the condition of the gates at the instant of arrival of the R or F pulses that set or reset the flip flops.

The digital detector circuit 30 includes a flip flop 86, called the C flip flop, which provides signals C and $\overline{C}$ on its respective set and reset output terminals. The C flip flop is set and reset by the same gate trees that set and reset the B flip flop, except that at the set terminal of the C flip flop the signal from the first tree of gates 62, 64, 66 is applied together with the B signal to an "and" gate 92, such that the C flip flop is not set unless the B flip flop is already in its set condition and receives another signal at its set input terminal 68. Under these circumstances, the C flip flop will detect and provide a digital output indicative of synchronization of the R and F pulses. More specifically, the C signal will go to "0" and the $\overline{C}$ signal will go to "1" when synchroized R and F pulses go out of synchronization in either direction due to the F pulse frequency becoming greater or lower than the R pulse frequency, and the C signal will got to "1" and the $\overline{C}$ signal will go to "0" on the first cycle of the R and F pulses going out of synchronization in the opposite direction from that in which they originally went out of synchronization.

The sample and hold phase comparator 32 includes a ramp generator 94 driven by R pulses, a holding condenser 96, typically .0068 microfarad, adapted to be charged and discharged to the level of the ramp, and an isolating circuit for sampling the ramp at discrete intervals. The isolating circuit includes a field effect transistor 98, a diode 100 and a resistor 102 typically 10,000 ohms. The field effect transistor has its source coupled to the ramp generator and its gate coupled to the anode of the diode. The holding condenser is connected between the collector of the field effect transistor and ground, and the resistor 102 is connected between the source and the gate of the field effect transistor.

The isolating circuit is driven by F pulses applied to the cathode of the diode to bias the diode "off," at which instant the field effect transistor goes "on" momentarily to appear as a low resistance of about 400 ohms connected between the ramp generator and the holding condenser 96 thus charging or discharging the condenser in accordance with the level of the ramp at that instant of time. With the disappearance of the F pulse, the diode goes back "on" and the field effect transistor turns "off" such that it appears to the holding condenser 96 essentially as an infinite resistance. The voltage level of the holding condenser is referred to herein as the S signal.

In the electronic switch 36, the A signal from the A flip flop and the S signal from the sample and hold phase comparator are applied respectively to the inputs of a first "and" gate 104 and a second "and" gate 106. The $\overline{C}$ signal is applied to the first "and" gate 104 and the C signal is applied to the second "and' gate 106. The output of the first and second "and" gates is applied through an "or" gate 108 to a control signal output terminal 110, and thence to the motor drive amplifier 12. Thus, when $\overline{C}$ is "1" indicating that the R and F pulses are out of synchronization, the A signal level which will be "1" or "0" depending on which direction the R and F pulses went out of synchronization will be applied through the "and" gate 104 and "or" gate 108 to the control signal output terminal 110. When the F and R pulses have returned to synchronization and gone out by one cycle in the opposite direction, C goes to "1" and $\overline{C}$ goes to "0" so that the A signal is blocked and the S signal from the sample and hold phase comparator passes through the second "and" gate 106 and the "or" gate 108 to the control signal output terminal 110.

Referring now to both FIGS. 1 and 2, the operation of the circuits is indicated in a qualitative sense by the wave forms shown. In these wave forms we assume that the motor is being brought up to speed under the influence of the R pulses, which causes A and $\overline{C}$ to be "1" and C to be "0," B being initially at "0." Normally, regardless of assumed initial conditions, the circuit will operate with a minor amount of readjusting of the conditions of the flip flops occuring during the first few R pulses. To minimize or avoid this readjustment the initial conditions shown in FIG. 2 may be provided by a one-shot pulse generator 112 energized through a switch 113 when the power supply (not shown) for the system is first turned on. The pulse from the one-shot pulse generator is applied through the "or" gates 54 and 76 to set the A flip flop and to reset the B and C flip flops respectively.

As can be seen in FIG. 2, the starting conditions indicate that the F pulse frequency is lower than the R pulse frequency such that two or more R pulses occur between F pulses, and the control output signal at the terminal 110 is the A signal from the digital frequency comparator. The A signal is "1" and provides a noise free drive signal to the motor drive amplifiers to cause the motor to run faster and hence increase the frequency of the F pulses. At the first instant where two F pulses 114, 118 occur between two R pulses 120, 122 and more particularly on the occurrence of the second F pulse 118 between the R pulses, the B flip flop not having been reset by an R pulse occurring between the two F pulses will remain with B at "1" thus permitting the second F pulse 118 to reset the A flip flop and set the C flip flop causing A to go to "0" and C to go to "1." The C signal going to "1" immediately causes the electronic switch 36 to remove the A signal and apply the S signal from the sample and hold circuit to the output signal control terminal 110 hence to the motor drive amplifier. The S signal, which previously has been meaningless due to the frequency difference between R and F, now contains phase information which is coherent and which contains a minimum of noise. The motor drive amplifier is adjusted so that the S signal causes the R and F pulses to lock into perfect synchronization exactly 180° out of phase, corresponding to the S signal sampling in the center of each successive ramp.

After synchronization has been achieved, assume that the variable load on the direct current motor increases thereby slowing down the motor and causing a phase lag in the F pulses, beginning with the F pulse indicated as 124. The S signal will gradually raise its level, thus driving the motor faster to increase its speed so as to return the F signals to proper phase synchronization. However, assume that the load increase is sufficiently great that it is beyond the control of the phase comparator output. This condition will be detected by the occurrence of two R pulses 126, 128 occuring between two F pulses 130, 132 and more specifically on the occurrence of the second R pulse 128 therebetween. At this instant B will go to "0" thereby preventing the succeeding F pulse 132 from resetting the A flip flop so that A stays at "1." At the same instant, the second R pulse 128, with A at "1," will drive C to "0" and $\overline{C}$ to "1" thus switching the control output signal over to A, which is at "1" and calls for an increased motor speed. Note that if the S signal continued to constitute the control output signal applied to the motor drive amplifier, it would have almost immediately gone to near "0" as at 134, telling the motor to slow down rather than to speed up, which is the opposite of the command desired, illustrating that the S output is meaningless when the R and F pulse frequencies are different.

The detector signal C will remain at "0" and the selected control output signal A will remain at "1" until such time as the second F pulse 136 of two F pulses occurs between two R pulses, indicating that the synchronized R and F pulses having gone out of synchronization in one direction have now gone out of synchronization in the opposite direction by one cycle. At this instant, C goes to "1" thus returning the sample and hold output signal S to the motor drive amplifier.

Beginning at the bottom of FIG. 2, the wave forms continue indicating that the S signal has returned the R and F pulses to perfect synchronization at 180° out of phase. Assuming a very suddenly decreased load on the motor, an interval may be reached where three F pulses occur between two R pulses, the second of these F pulses being indicated at 138. This second F pulse will reset the C flip flop causing C to go to "0" and $\overline{C}$ to go to "1" thereby switching the control signal output to A which is at "0," commanding the motor to slow down in order to bring the F pulses back into synchronization with the R pulses. This situation will continue until the instant occurs when two R pulses occur between two F pulses, the second such R pulse being indicated at 140 at which instant the C flip flop will be set, causing C to go to "1" and $\overline{C}$ to go to "0," thereby switching the control output terminal to S. Again, the detecting circuit 30 has indicated the synchronized R and F pulses going out of synchronization in one direction, and has detected their going out of synchronization in the opposite direction by one cycle.

A clearer comparison between the noise level in the S and A signals is indicated in the bracket area 142. As can be seen, the system normally operates in synchronization where the S signal contains very little noise, the sampling being at the middle of each succeeding ramp. What amounts to a heavy load decrease begins with an F pulse 144. The dotted lines in the A wave forms indicate what the A wave forms would be for perfect synchronization, and serve to illustrate that the A wave forms contain phase information in terms of varying pulse widths.

While the varying pulse widths of the A waveform contain phase information in the form of modifying the average or means level of the alternating A signal, there is a very low signal to noise ratio which drastically limits the response of the motor to variations in the phase information if the motor is to be insensitive to the noise. As can be seen, the S signal by comparison contains digital changes which are direct variations in the control signal and is such that a very high signal to noise ratio is achieved.

I claim:

1. In a servo loop for providing a control signal responsive to the frequency and phase difference between a reference signal and a feedback signal, the combination which comprises a phase comparator responsive to the reference and feedback signals for providing an output signal varying with phase difference, a digital frequency comparator responsive to the reference and feedback signals for generating an output signal at a first level responsive to synchronous reference and feedback signals going out of synchronization in one direction and an output signal at a second level responsive to synchronous reference and feedback signals going out of synchronization in the opposite direction, means for detecting synchronization of the reference and feedback signals, a control signal output terminal, and switch means responsive to the detecting means for alternatively coupling the output of the phase comparator and the digital frequency comparator to the control signal output terminal.

2. The apparatus of claim 1 wherein the digital frequency comparator includes means responsive to the reference and feedback signals going out of synchronization in either direction for locking the digital frequency comparator output signal level until the first cycle of the reference and feedback signals going out of synchronization in the opposite direction.

3. The apparatus of claim 2 wherein the detector means includes means for registering a first output signal responsive to synchronized reference and feedback signals going out of synchronization in either direction and a second output signal responsive to the first cycle of the reference and feedback signals going out of synchronization in the opposite direction; and, wherein the switching means includes means responsive to the first output signal of the detector means for coupling the output of the digital frequency comparator to the control signal output terminal and responsive to the second output signal of the detector means for coupling the output signal of the phase comparator to the control signal output terminal.

4. The apparatus of claim 3 wherein the reference and feedback signals are pulse trains and the phase comparator is a sample and hold circuit driven by the reference and feedback pulses.

References Cited

UNITED STATES PATENTS

| | | | |
|---|---|---|---|
| 3,071,644 | 1/1963 | Olive | 179—100.2 X |
| 3,097,267 | 7/1963 | Clark et al. | |
| 3,175,159 | 3/1965 | Hall | 318—314 X |
| 3,395,326 | 7/1968 | Hebb | 318—318 X |

JOHN S. HEYMAN, Primary Examiner

R. C. WOODBRIDGE, Assistant Examiner

U.S. Cl. X.R.

318—314, 318; 328—134, 141